United States Patent
Berg et al.

(10) Patent No.: US 11,632,139 B2
(45) Date of Patent: Apr. 18, 2023

(54) EFFICIENT TRANSFER OF IQ SAMPLE DATA

(71) Applicant: Telefonaktiebolaget LM Ericsson (publ), Stockholm (SE)

(72) Inventors: Miguel Berg, Sollentuna (SE);
Chenguang Lu, Sollentuna (SE);
Daniel Cederholm, Sollentuna (SE);
Jan Roxbergh, Sollentuna (SE);
Fredrik Huss, Sundbyberg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 17/312,932

(22) PCT Filed: Dec. 28, 2018

(86) PCT No.: PCT/SE2018/051375
§ 371 (c)(1),
(2) Date: Jun. 10, 2021

(87) PCT Pub. No.: WO2020/122780
PCT Pub. Date: Jun. 18, 2020

(65) Prior Publication Data
US 2022/0070045 A1    Mar. 3, 2022

(30) Foreign Application Priority Data
Dec. 10, 2018   (WO) ................. PCT/SE2018/051267

(51) Int. Cl.
*H04B 1/04*    (2006.01)
*H04B 1/10*    (2006.01)
(Continued)

(52) U.S. Cl.
CPC ............ *H04B 1/0475* (2013.01); *H03M 7/24* (2013.01); *H04B 1/10* (2013.01); *H04L 27/3444* (2013.01)

(58) Field of Classification Search
CPC ......... H04B 1/0475; H04B 1/10; H03M 7/24; H04L 27/3444
See application file for complete search history.

(56) References Cited

U.S. PATENT DOCUMENTS

| | | | |
|---|---|---|---|
| 7,088,276 B1 | 8/2006 | Wegener | |
| 2012/0250740 A1 | 10/2012 | Ling | |
| 2019/0339937 A1* | 11/2019 | Lo | ........................ G06F 7/4876 |

FOREIGN PATENT DOCUMENTS

| | | |
|---|---|---|
| CN | 102316517 A | 1/2012 |
| EP | 3065324 A1 | 9/2016 |

(Continued)

OTHER PUBLICATIONS

International Search Report and Written Opinion for Application No. PCT/SE2018/051375, dated Feb. 21, 2019, 12 pages.

(Continued)

*Primary Examiner* — Janice N Tieu
(74) *Attorney, Agent, or Firm* — Nicholson De Vos Webster & Elliott LLP (57) ABSTRACT

In mobile communications networks, requirements on signal distortion may be fulfilled at a lower bit rate, or alternatively quantization noise be reduced for a given bit rate, by including fractional exponent bits in a block floating point format. One or more fractional exponent bits may apply to all samples in the block. Alternatively, fractional bits may apply to sub-blocks within the block. The optimal number of fractional bits depends on the number of samples in the block.

10 Claims, 11 Drawing Sheets

(51) Int. Cl.
*H03M 7/24* (2006.01)
*H04L 27/34* (2006.01)

(56) References Cited

FOREIGN PATENT DOCUMENTS

| RU | 2305898 C2 | 9/2007 |
|---|---|---|
| WO | 2009151893 A2 | 12/2009 |
| WO | 2020122772 A1 | 6/2020 |

OTHER PUBLICATIONS

International Preliminary Report on Patentability for Application No. PCT/SE2018/051375, dated Jun. 24, 2021, 9 pages.
International Search Report and Written Opinion for Application No. PCT/SE2018/051267, dated Feb. 19, 2019, 12 pages.
International Preliminary Report on Patentability for Application No. PCT/SE2018/051267, dated Jun. 24, 2021, 9 pages.
E. Lintz Christensen, "Block Floating Point for Radar Data," Jan. 1999, pp. 308-318, IEEE Transactions on Aerospace and Electronic Systems, vol. 35, No. 1, IEEE.
Ericsson AB et al., "Common Public Radio Interface (CPRI); Interface Specification," Oct. 9, 2015, 128 pages, CPRI Specification V7.0.
Cheolwoo You, "Near-lossless compression/decompression algorithms for digital data transmitted over fronthaul in C-RAN," Aug. 23, 2016, pp. 533-548, Springer Science+Business Media, New York.
Office Action and Search Report, RU App. No. 2021119923, dated Feb. 15, 2022, 16 pages (4 pages of English Translation and 12 pages of Original Document).
"xRAN Fronthaul Working Group, Control, User and Synchronization Plane Specification," 2018, 156 pages, XRAN-FH.CUS.0-v02.00, Technical Specification, xRAN.org.
Notice of Allowance, U.S. Appl. No. 17/312,920, dated Feb. 21, 2023, 10 pages.

\* cited by examiner

Figure 1

Prior Art

Figure 2

Prior Art

EFFICIENT TRANSFER OF IQ SAMPLE DATA

CROSS-REFERENCE TO RELATED APPLICATIONS

This application is a National stage of International Application No. PCT/SE2018/051375, filed Dec. 28, 2018, which claims priority to International Application No. PCT/SE2018/051267, filed Dec. 10, 2018, which are hereby incorporated by reference.

BACKGROUND

In wireless communication networks, a fronthaul interface is used when different parts of a base station, e.g. baseband processing and radio, are separated into different physical devices or even different locations.

Figure 1:
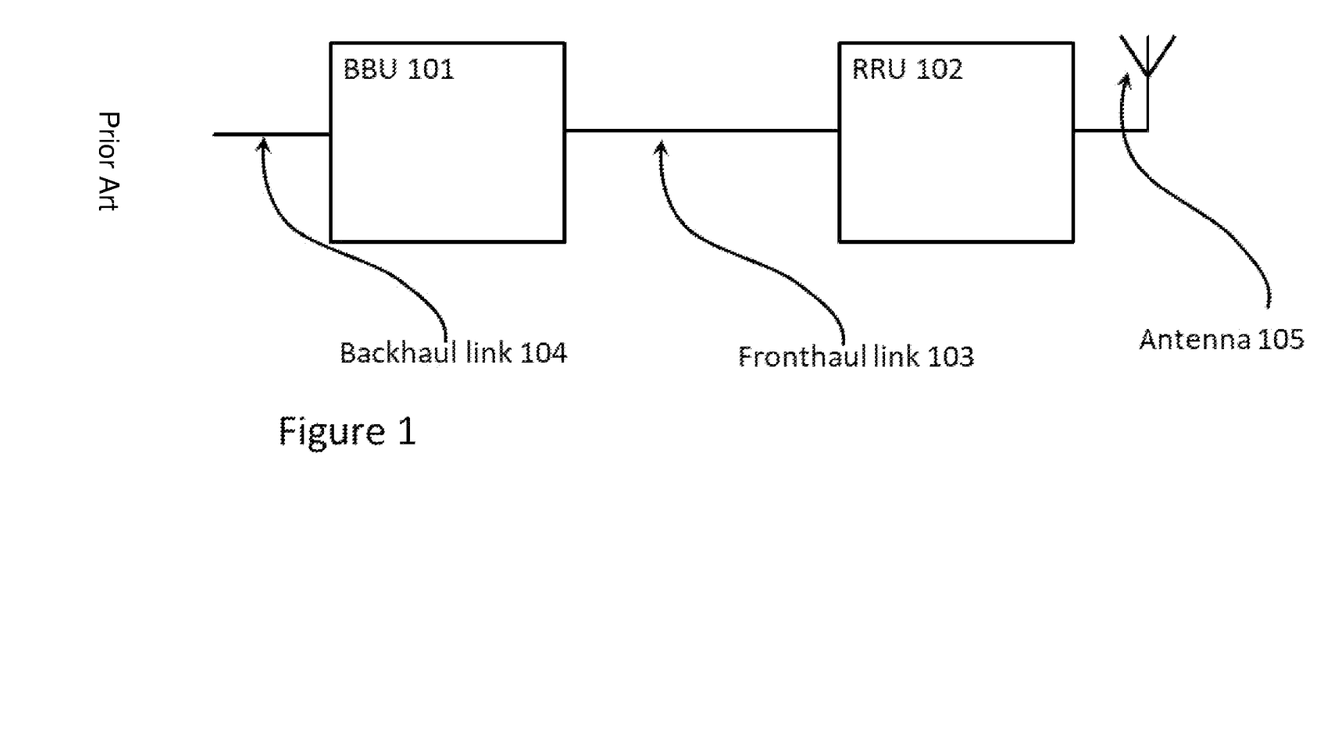
FIG. 1 is a schematic diagram of an environment in which embodiments presented herein can be applied.

FIG. 1 shows a baseband unit, BBU 101 connected via a fronthaul link to a remote radio unit, RRU 102 via a fronthaul link 103. The BBU 101 is typically connected to a core network (not shown) via a backhaul link 104. The RRU may e.g. be located at the top of an antenna tower or on a tall building.

The BBU may or may not be co-located with the RRU, e.g. in an enclosure on the ground near the antenna tower, or in a remote data center In wireless communication networks, data samples transferred over fronthaul links are usually represented in the well-known IQ format, in which a signal is described by two component signals with a phase difference of 90 degrees.

Classical Common Public Radio Interface, CPRI, implementations often use 30 bits for one IQ sample (15 bit I, 15 bit Q). However more efficient data formats for IQ samples are becoming increasingly important with the advent of Massive MIMO utilizing a large number of antennas as well as wide 5G NR carriers requiring high sample rates. Fronthaul bitrate scales linearly with the number of antennas (or layers or beams in some implementations) and the sample rate, hence very high bit rates may be required.

By decreasing the number of bits in the IQ format, fronthaul bitrate requirement is decreased proportionally. This is also true for other low-layer functional splits, e.g. intra-PHY splits for LTE and NR. A decreased number of bits means, on the other hand, increased quantization noise.

One example of an intra-PHY split is the xRAN Low Layer Split (LLS) [xRAN Fronthaul Working Group, technical specification XRAN-FH.CUS.0-v02.00, "Control, User and Synchronization Plane Specification", published 2018 Jul. 27]

The xRAN fronthaul working group has published a fronthaul specification for interfacing between a LLS-CU (low layer split central unit), and an RU (radio unit). The specification supports 3GPP LTE and NR.

IQ samples are often handled in blocks. For CPRI (with PHY-RF split), the block size may be related to the number of IQ samples from a carrier that fits in a CPRI basic frame. For functional splits where frequency domain IQ samples (e.g. per layer, per beam, or per antenna) are transported over the fronthaul interface, block size may be related to the size of a resource block (12 resource elements in LTE and NR). This is the case e.g. for the xRAN LLS, which has a block size of 24 (12 complex values). For beamforming coefficients (also called beam weights), it may be natural to use a block size which is equal to the number of antennas, or an integer fraction of the number of antennas. This typically means that the block size is a power of 2.

Fixed point number formats are easy to implement but require many bits to achieve large dynamic range, which is needed for uplink samples. Floating-point can achieve larger dynamic range for a given number of bits. A common floating-point format in computers is IEEE 754. It supports radix 2 (binary) and 10. Radix 2 is more common since the implementation complexity is lower while radix 10 is used e.g. in finance where it is necessary to accurately represent decimal fractions. A represented number is the mantissa multiplied by the base (here 2 or 10) raised to the power of the exponent.

Block floating point, BFP, is a format where one exponent is shared by multiple samples. For data where adjacent samples have similar power levels, BFP can be advantageous since it is more efficient than regular floating point. It fits well with IQ sample or beam weight block handling.

Figure 2:
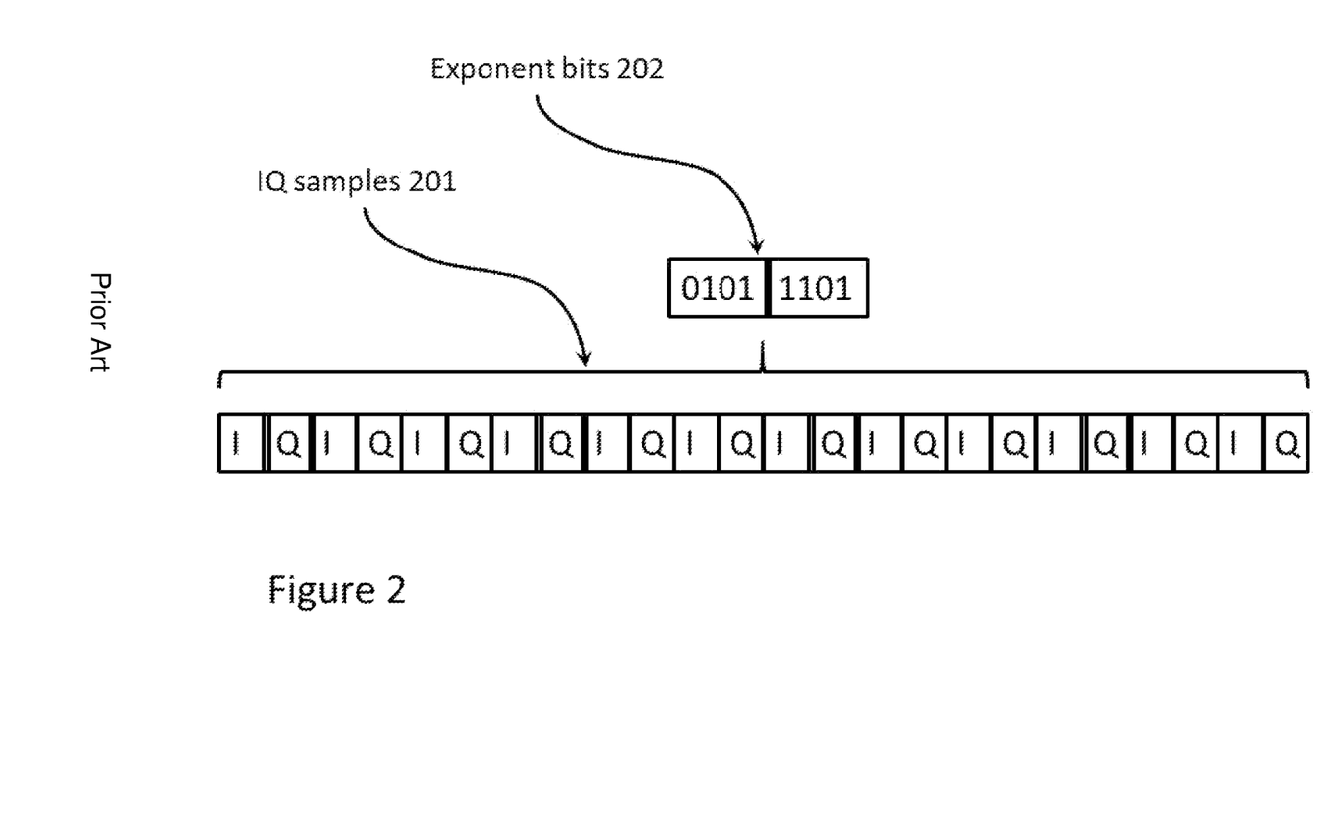
FIG. 2 is a schematic diagram of a block floating point format.

FIG. 2 shows a block floating point format with 12 IQ sample pairs and 8 exponent bits. In a typical format using a base of 2, original samples are bit shifted to be as large as possible while the largest sample still fits in the mantissa size of the transfer block. The resulting values are rounded and truncated to the mantissa size and transferred along with exponent bits indicating the number of bit shifts made. An original sample is restored by reversing the bit shift as indicated by the exponent bits. The shift is equivalent to multiplying the transferred sample with 2 raised to the power of the exponent indicated by the exponent bit Given the increasing need for data transfer over fronthaul links, there is a need for further efficiency improvement.

The granularity of available link speeds for fronthaul transport is quite coarse. This is true both for CPRI (Common Public Radio Interface) and for eCPRI with Ethernet transport. Further, the number of antennas, beams, or layers supported by a radio is typically a power of 2. If the desired configuration does not fit in a specific fronthaul link, either a higher link speed or more links are needed. In both cases, cost will increase.

For binary (radix 2) floating-point, a change in the exponent of one step means 6 dB change of value range and equal change of quantization noise. If mantissa bit width is reduced or increased by 1 bit, quantization noise is increased or decreased by 6 dB respectively. In certain cases, the cost of an additional mantissa bit cannot be afforded due to fronthaul bitrate limitations, while it is desired to decrease quantization noise to fulfil e.g. Error Vector Magnitude (EVM) or other performance requirements.

Hence, in cases of standard link types where the required data rate is close to the maximum rate, or the noise level is close to a required maximum level, even small improvements in efficiency or noise can be of great value.

SUMMARY

It is an object to increase the efficiency of fronthaul data transfer in wireless communication networks.

It is an object to enable transmission with reduced bit rate or reduced quantization noise.

It is an object to fit a fronthaul data stream into a link type allowing a given bit rate while fulfilling requirements for maximum allowable signal distortion.

According to a first aspect it is provided a method for fronthaul data transfer that is performed in a first network node of a wireless communications network. The method comprises sending IQ sample pairs or beam coefficients in a block floating point format to a second network node of the wireless communications network via a fronthaul link. The blocks have a size Ns equal to or greater than 4 and include Ne integer exponent bits and Nf fractional exponent bits, Nf being at least 1.

The Ne integer exponent bits of a block may be applicable to all samples in the block and two or more disjunct sets of fractional exponent bits out of the full set of Nf fractional exponent bits be applicable to corresponding disjunct subsets of samples out of the full set of Ns samples in the block.

A block of size Ns=24 may comprise 12 IQ sample pairs, the number of integer exponent bits Ne be 4 and the number of fractional exponent bits Nf be 4, each fractional exponent bit being applicable to 3 IQ sample pairs.

A block of size Ns=24 may comprise 12 IQ sample pairs, the number of integer exponent bits Ne be 2 and the number of fractional exponent bits Nf be 6, each fractional exponent bit being applicable to 2 IQ sample pairs.

The block size Ns may be 8 or greater and Nf be at least 2.

Ne may be less than 8 and Nf less than or equal to 8-Ne.

At least one fractional exponent bit may signify for an IQ pair a magnitude change by a factor of 2 raised to the power of N/2, where N is an odd integer, and a rotation in the complex plane of an odd integer multiple of 45 degrees.

According to a second aspect it is provided a network node comprising means for performing any of the methods according to the first aspect.

According to a third aspect it is provided a computer program for performing any of the methods according to the first aspect in a network node according to the second aspect.

According to a fourth aspect it is provided method according to the first aspect, or a network node according to the second aspect, or a computer program according to the third aspect, wherein the first network node is a Base Band Unit, BBU, and the second network node is a Remote Radio Unit, RRU.

According to a fifth aspect, it is provided a method according to the first aspect, or a network node according to the second aspect, or a computer program according to the third aspect, wherein the first network node is a Remote Radio Unit, RRU, and the second network node is a Base Band Unit, BBU.

According to a sixth aspect, it is provided a network node comprising a processor and memory storing instructions that, when executed by the processor, cause the network node to perform the methods according to the first aspect.

According to a seventh aspect, it is provided a method for fronthaul data transfer performed in a first network node of a wireless communications network. The method comprises the steps of: obtaining a set of at least two IQ sample pairs, determining a greatest integer exponent being such that when multiplying each sample with a base raised to the power of the exponent, each sample will fit into a fixed mantissa size, multiplying each sample accordingly, for all the samples, or separately for the samples of two or more subset thereof, determining a fractional exponent between 1 and 2 such than the samples when multiplied by the base raised to the power of the exponent will fit into the fixed mantissa size, multiplying each sample accordingly; and sending to a second network node of the wireless communication network over a fronthaul link the multiplied samples together with an indication of the determined integer exponent and the one or more determined fractional exponents.

The first network node may be a Base Band Unit, BBU, and the second network node a Remote Radio Unit, RRU.

The first network node may be a Remote Radio Unit, RRU, and the second network node a Base Band Unit, BBU.

According to an eight aspect, it is provided a network node which comprises a processor and memory storing instructions that, when executed by the processor, cause the network node to obtain a set of at least two IQ sample pairs, determine the greatest integer exponent being such that when multiplying each sample with a base raised to the power of the exponent, each sample will fit into a fixed mantissa size, multiply each sample accordingly, for all the samples, or separately for the samples of two or more subset thereof, determine a fractional exponent between 1 and 2 such than the samples when multiplied by the base raised to the power of the exponent will fit into the fixed mantissa size, multiply each sample accordingly; and send to a second network node of the wireless communication network over a fronthaul link the multiplied samples together with an indication of the determined integer exponent and the one or more determined fractional exponents.

The first network node may be a Base Band Unit, BBU, and the second network node a Remote Radio Unit, RRU.

The first network node may be a Remote Radio Unit, RRU, and the second network node a Base Band Unit, BBU.

According to a ninth aspect, it is provided a computer program product comprising computer program code which when run on a network node causes the network node to perform the method according to the seventh aspect, and a computer readable means on which the computer program code is stored.

DETAILED DESCRIPTION

Fractional exponent bits are bits that specify a multiplier of the base raised to a non-integer power, for example ½.

Floating-point numbers typically use binary mantissa and binary exponent since this gives the most efficient implementation in binary computers. By including fractional exponent bits in addition to the integer exponent bits, it is possible under certain conditions to improve performance. Above a certain block size, adding fractional exponent bits means lower fronthaul bitrate increase than adding mantissa bits for a given SQNR, signal to quantization noise ratio, improvement.

Fractional exponent might be beneficial even for smaller block sizes (fewer values sharing the same exponent) since it might be difficult to add fractional bit widths to the mantissa. Fractional mantissa bits meaning that mantissa bits are shared by several values in a way that apportions to each value a range not corresponding to an integer power of two.

For applications where zero-padding is used to achieve byte/word alignment, adding fractional exponent bits does not necessarily lead to increased bit rate if at least some of the zero padding bits are used. As an example, the block floating-point format in xRAN has a four-bit integer exponent, and zero padding is used for byte alignment. Thus, up to 4 fractional exponent bits could be added without increasing the fronthaul bit rate.

Fractional exponent bits are useful not only for IQ samples in time domain but can also be used for different low-layer splits where frequency domain IQ samples are sent, e.g. in element space, beam space or per MIMO layer. They can also be applied to beamforming weights.

Below, block floating-point formats are specified e.g. as Ns×Nm+Ne where Ns is the number of real samples sharing an exponent, Nm is the number of bits in each mantissa, and Ne is the number of integer exponent bits. The container size C, i.e. the number of bits necessary to store one complete block with mantissas and exponent, can be found by evaluating the format specification. For example, format 2×11+2 has a container size of 24 bits.

Floating point formats used in computers and digital signal processors (DSPs) commonly have binary mantissa of a certain width and a binary (signed or unsigned) exponent with Ne bits. Increasing the exponent one step means to double the input value range. If a value is only slightly too large to fit in the mantissa range for a certain exponent, then the exponent has to be increased, which in turn increases quantization noise by 6 dB.

It is here shown to be advantageous to use one or more fractional exponent bits for block floating-point formats applied to IQ samples (time, frequency, and/or spatial domain) as well as to beamforming weights. With fractional exponent bits, smaller steps than 6 dB can be taken.

Increasing mantissa width by 1 bit gives approximately 6 dB reduction of quantization noise at the cost of increased number of bits needed to represent the data (e.g. higher bit rate in fronthaul links or larger memory usage in processing nodes). It has been found empirically for common block sizes that the first fractional exponent bit gives approximately 1.7 dB reduction of quantization noise, while the second bit gives approximately 0.85 dB reduction. Thus, adding the first fractional exponent bit is slightly better from rate-distortion perspective than increasing the mantissa width by ¼ (1.5 dB). This means that when 4 or more values share the same exponent, it is better to add a first fractional exponent bit instead of increasing mantissa widths by ¼ bit. The second fractional exponent bit is beneficial when 8 or more values share one exponent and so on. As can be seen, returns are diminishing, which means that the benefit of adding more than four fractional exponent bits is rather small.

Complexity of implementation increases somewhat with the number of fractional exponent bits. In xRAN, fractional exponent could be signaled either as a new compression method in the udCompMethod field using one of the reserved codes 0100b-1111b, or by adding a new parameter udIqFracExpWidth, describing the number of fractional exponent bits. It is also possible to describe this over the management plane.

It may be sufficient for a transmitting unit to be informed of how many bits of fractional exponent that the receiving unit supports at most. The transmitting unit can choose to use a subset of the fractional exponent bits that the receiver supports and set the remaining ones to zero, for example if the transmitting unit supports fewer fractional exponent bits than the receiving unit. This could reduce the need for signaling. If, for example, the remote unit reports (via management plane) support for receiving 4 fractional exponent bits, then the central unit can decide to use 0-4 fractional exponent bits when encoding IQ samples or beam weights to send to the remote unit.

It could even be possible for a unit to learn what the other unit supports without any extra signaling. This could be done if a unit sets all fractional bits that it supports to 1 in the first messages. If the other end can support these bits, it will decode them as usual and assume that the first unit also can receive messages with the same number of fractional exponent bits.

One way of implementing an encoder for fractional exponent is as follows. The number of integer exponent bits is denoted Ne, the number of fractional exponent bits is denoted Nf, the number of mantissa bits is Nm, the number of mantissa values sharing an exponent is Ns:

1. Pre-calculate a set of $2^{N_f}$ multipliers. The set of multipliers could be e.g. $K=\{2^{k\varphi}\}$, where $k=0,1,\ldots,2^{N_f}-1$ and $\varphi=2^{N_f}$. For $Nf=1$, the resulting multipliers will then be $\{1,\sqrt{2}\}$. The first multiplier (for $k=0$) is always 1 and could be omitted. It is included here to simplify the description. Multipliers can be encoded e.g. in fixed-point or floating-point depending on what the architecture supports.
2. Find the integer exponent ε with prior art methods for block floating point.
3. Find the largest multiplier in the set K, which can be applied to all mantissa values within a block of Ns values and still keep all scaled mantissas within the mantissa range. This can be done e.g. by trial-and-error, or by calculating one threshold per multiplier and checking values against thresholds. If the first multiplier in the list is omitted, simply set k=0 if none of the other multipliers worked.
4. Apply the multiplier found in step 3. Also apply the desired rounding scheme and select which bits to keep for mantissas according to the previously found integer exponent, e.g. by shifting the bits right and keeping Nm least significant bits of the representation (i.e. the most significant bits of the value).
Set the fractional exponent bits in the result according to the index of the selected multiplier.
5. Optional: if desired, calculate the complete exponent as ε−kφ. Thus if k=0, the integer exponent was kept.

Figure 3:
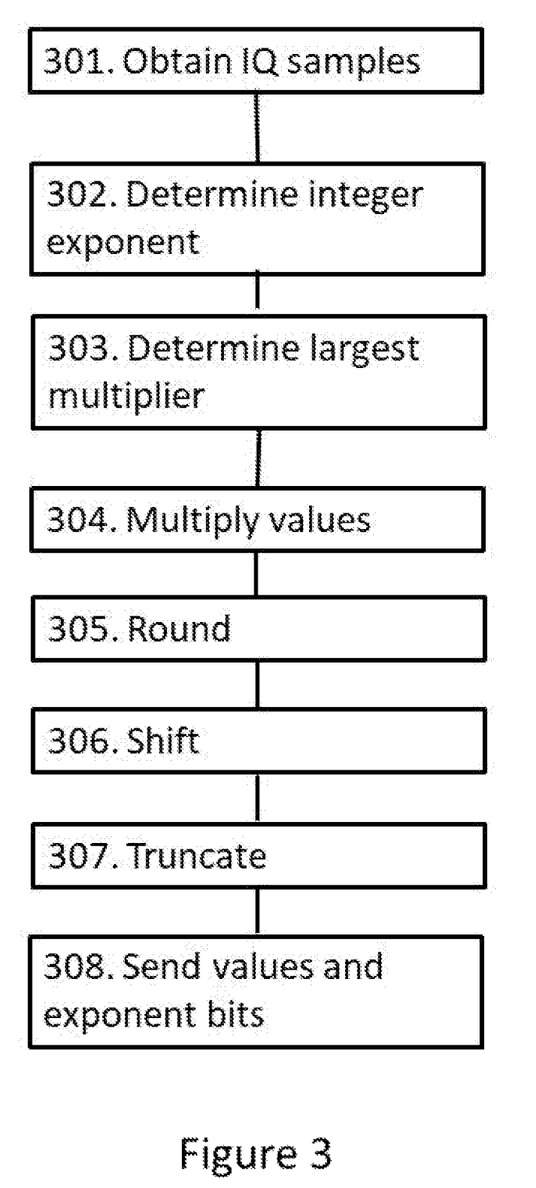
FIG. 3 is a flow diagram of a method for efficient transfer of IQ sample data using a block floating point format and fractional exponents wherein fractional exponent bits apply to all samples of a block.

With reference to FIG. 3 then, an efficient method for transfer of IQ samples, beam weights or the like is as follows. The base is here 2.

The transmitting unit may be a BBU, transmitting downlink data to an RRU, or the RRU may transmit uplink data to the BBU. The methods herein described may applied to both of these cases simultaneously.

In a step 301, IQ samples are obtained by the transmitting unit.

In a step 302, an integer exponent is determined such that the largest value in the block divided by the base raised to the power of exponent is as large as possible while still fitting in the size of the mantissa of the transfer block.

In a step 303, the largest multiplier is determined for which the largest value will still fit in the mantissa size.

In a step 304, all values of the block to be transferred are multiplied by the multiplier of step 303.

In a step 305, the values are rounded to the number of bits of the mantissa.

In a step 306, all values of the block are bit-shifted corresponding to a division according to the exponent determined in step 302.

In a step 307, the most significant bits of the representation exceeding the mantissa size and now containing only zeroes are truncated, to form a binary number with the number of bits equal to the mantissa size.

In a step 308, the values are sent, together with exponent bits indicating the determined integer exponent of step 302 and fractional exponent bits indicating the determined multiplier of step 303.

At the receiving network node, the values are subjected to a reverse process where an opposite bit shift is performed, as indicated by the integer exponent bits, and divided by the multiplier as indicated by the fractional exponent bits.

A less complex alternative to using Nf>1 is to divide the BFP block into sub-blocks and use 1 fractional exponent bit per sub-block. As an example for xRAN, a BFP block of 24 samples could be divided into 4 sub-blocks. The integer exponent would still be a common exponent for all 24 samples but each sub-block would have its own fractional exponent bit. Performance will be worse than when all 4 fractional exponent bits are used for the whole block but better than the case when only 1 fractional exponent bit is used for the whole block.

Figure 4:
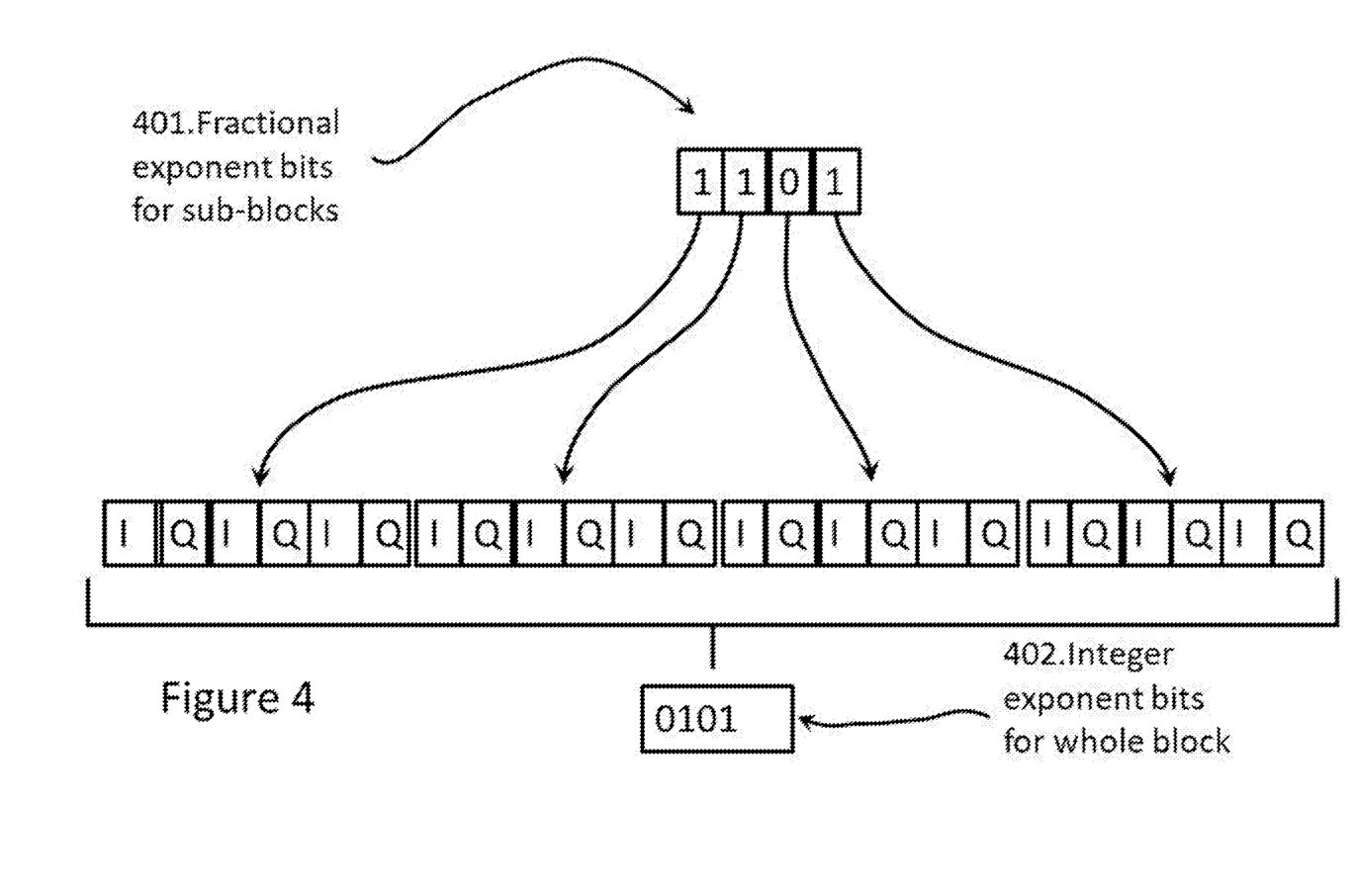
FIG. 4 is a schematic diagram of a block floating point format with fractional exponent bits applicable to subset of the full set of samples in the block.

FIG. 4 shows such a format, where each one of four fractional exponent bits 401 applies to a sub-block of three IQ samples, whereas four integer exponent bits 402 apply to all samples in the block.

If it is not necessary to have 4 integer exponent bits (e.g. for downlink), it would be possible to have e.g. 2 integer exponent bits and 6 sub-blocks, each with 1 fractional exponent bit covering 4 samples.

Figure 5:
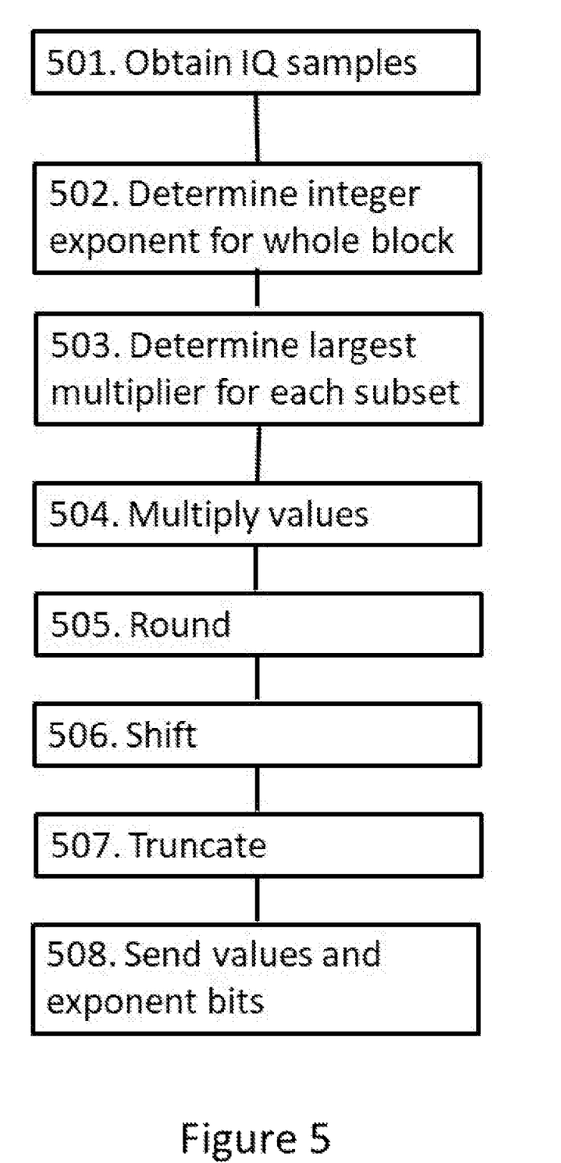
FIG. 5 is a flow diagram of a method for efficient transfer of IQ sample data using a block floating point format and fractional exponents wherein fractional exponent bits apply to sub-blocks within the block.

FIG. 5 shows a method which is similar to the method of FIG. 3, but where an individual multiplier is determined for each sub-block. Where the multiplier is denoted by a single bit per sub-block, the multiplier may be either 1 or a value between one and two, e.g. $\sqrt{2}$.

In a step 501, IQ samples are obtained by the transmitting unit.

In a step 502, an integer exponent is determined such that the largest value in the block divided by the base raised to the power of exponent is as large as possible while still fitting in the size of the mantissa of the transfer block.

In a step 503, for each sub-block the largest multiplier is determined for which the largest value of the sub-block will still fit in the mantissa size.

In a step 504, all values of each sub-block to be transferred are multiplied by the corresponding multiplier determined in step 503.

In a step 505, the values are rounded to the number of bits of the mantissa.

In a step 506, all values of the block are bit-shifted corresponding to a division according to the exponent determined in step 502.

In a step 507, the most significant bits of the representation exceeding the mantissa size and now containing only zeroes are truncated, to form a binary number with the number of bits equal to the mantissa size.

In a step 508, the values are sent, together with exponent bits indicating the determined integer exponent of step 502 and fractional exponent bits indicating the determined multipliers of step 503.

At the receiving network node, the values are subjected to a reverse process where an opposite bit shift is performed, as indicated by the integer exponent bits, and the values of each sub-block are divided by the corresponding multiplier as indicated by the corresponding fractional exponent bits.

Regarding the steps 302 and 502 the operation of finding the exponent may also be expressed as finding the largest integer exponent for which the value, when multiplied by the base raised to the value of the exponent would still fit in the mantissa. When formulated in this way, the sign of the exponent would be the opposite of the sign of the exponent when determined as described for steps 302 and 502.

An example showing the operations according to FIG. 3 or 5 for a single value is as follows.

The base is 2 and there is one fractional exponent bit, representing a multiplier of $\sqrt{2}$ when it is 1, and a multiplier of 1 (i.e. no multiplication) otherwise. The mantissa size of the block transfer format is 5 value bits plus a sign bit which is not shown here.

A value to be transmitted is obtained (step 301, 501), in this case it is 000000101011110 binary (350 decimal)

in a representation with 15 value bits and a sign bit (sign bit not shown here).

Assuming that this is the largest value in the block, the integer exponent is determined to be 4, since a right bit shift of four positions (division by 2 to the power of 4) would fit the most significant bits of the value in the five value bits of the mantissa. (step 302, 502)

Next the largest multiplier for fractional exponent is determined (step 303, 503). In this case there is only the choice of 1 (no multiplication) or $\sqrt{2}$. In this case a multiplication by $\sqrt{2}$ is possible as it would not increase the number of bits in the value.

The value is multiplied by $\sqrt{2}$ (step 304, 504) and becomes 000000111101111 (495 decimal)

The value is rounded to 5 significant value bits (step 305, 505) and becomes 000000111110000 (496 decimal, or 31 times 2 to the power of 4)

Next, the bits are shifted right 4 steps according to the selected integer exponent of 4 (step 306, 506), resulting in 000000000011111 (31 decimal).

The four least significant bits of the value are thus truncated by the shift operation.

The most significant bits of the representation (containing all zeroes) are then truncated (step 307, 507), resulting in the 5-bit representation

11111

11111 is transmitted (step 308, 508), along with the other values of the block, an indication of the integer exponent (4) and an indication of the fractional exponent (a 1 in this case, indicating that a multiplication by $\sqrt{2}$ was made)

At the receiving network node, the received bits 11111 are loaded into a larger representation, in this case the same 15+1 bits as above, resulting in

000000000011111

The bits are left-shifted 4 steps as specified by the integer exponent, resulting in 000000111110000 (496 decimal)

Finally, the multiplication by $\sqrt{2}$ is then reversed by dividing by $\sqrt{2}$, resulting in 000000101011111 (351 decimal)

When a fractional exponent bit signifying a multiplier of $\sqrt{2}$ is used for value pairs such as IQ samples, calculation efficiency can be considerably improved by applying a modified procedure. The IQ value pair is treated as a complex number and multiplied by the complex number (a+jb) where a=+/−1 and b=+/−1, for example (1+j). This increases the magnitude of the complex number by $\sqrt{2}$ and rotates it by, in this case, 45 degrees. At the receiving end, a corresponding multiplication by (a−jb), in this case (1−j) restores the rotation and multiplies by a further factor $\sqrt{2}$. Finally, a single bit shift for I and Q divides by 2 and restores the original value pair. A particular advantage of this procedure is that the multiplication can in fact be carried out using mere addition and/or subtraction which is computationally efficient.

E.g. $y_k=(1+j)\cdot x_k=(Re(x_k)-im(x_k)+j\cdot(Re(x_k)+Im(x_k))$ where $y_k$ is the result of rotating and magnitude-increasing the original IQ value pair $x_k$.

In general, a change of magnitude of the complex number by a factor of 2 raised to the power of N/2 where N is an odd integer combined with a rotation in the complex number of an odd integer multiple of 45 degrees can be implemented efficiently in this way. These alternatives are achieved by the different combinations of +1 or −1 for a and b above.

The procedure is advantageous in all cases where a value pair before transmission is to be multiplied by $\sqrt{2}$ or in general 2 raised to the power of N/2 where N is an odd integer and to be restored after reception.

Figure 6:
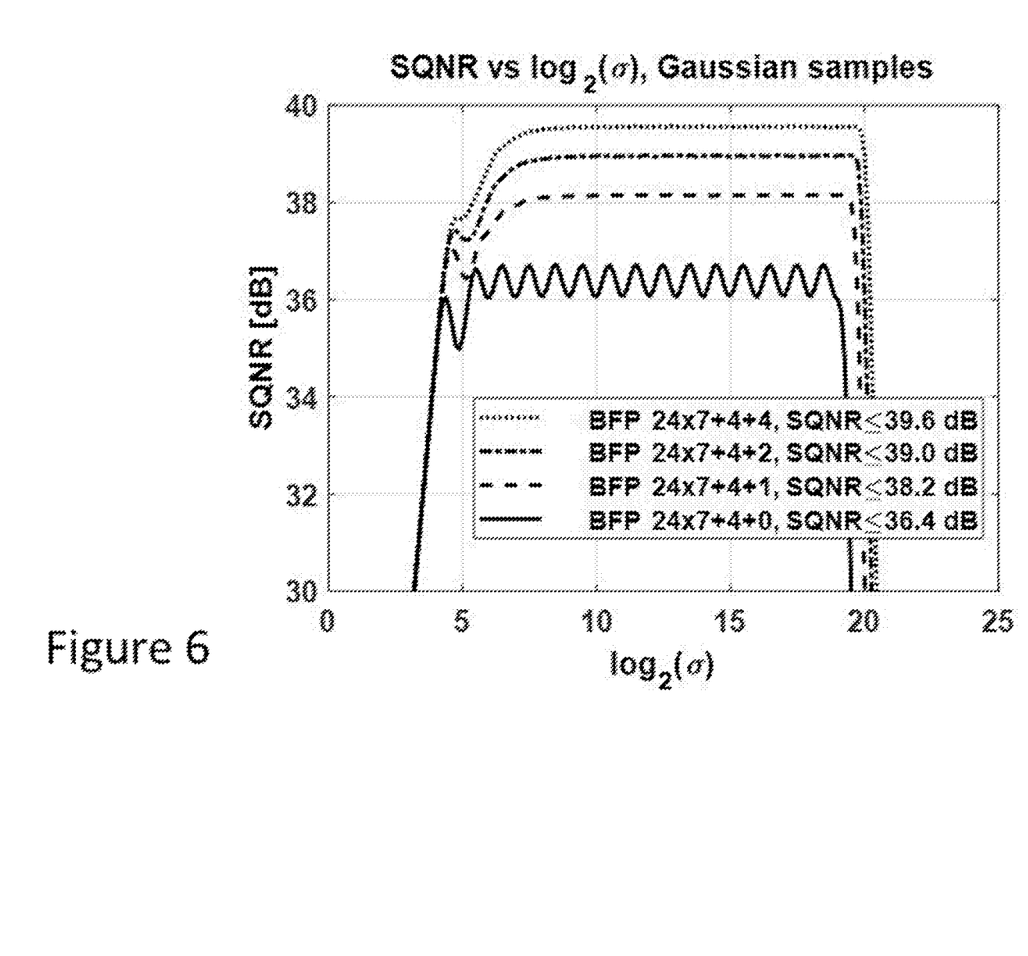
FIG. 6 is a diagram showing a signal to quantization noise ratio versus a logarithm of signal strength.

FIG. 6 shows simulation results for four different formats with 7 bit mantissa; one prior art format (xRAN BFP 24×7+4+0 where all samples in one PRB share a 4-bit exponent) and three new formats: 24×7+4+1, 24×7+4+2, and 24×7+4+4, having 1, 2, and 4 fractional exponent bits respectively.

As can be seen in the figure, the new formats have both better maximum SQNR and larger dynamic range than the prior art formats. Further, the SQNR ripple in the xRAN BFP format goes away already after adding one fractional exponent bit.

It can be seen that performance of the data format comes closer to the Shannon rate-distortion bound. This can be an important advantage, as even a few dB improvement of signal quality can be the difference between pass and fail of signal quality requirements at a given link capacity. It can also mean the difference between achieving air-interface peak rate and not reaching peak rate at any channel condition.

For an embodiment of the invention with 4 fractional exponent bits, performance is thus approximately 3.2 dB better than no fractional exponent. For a block floating-point scheme with 24 values (e.g. 12 complex samples) sharing one exponent, this performance increase corresponds to an increase in mantissa bit width of slightly more than ½ bit per real sample while the cost is only 4/24=⅙ bit per real sample. In the xRAN case, the cost might be zero if fractional exponent bits are sent in the zero-padding bits for the exponent.

In some cases, it may be advantageous to have a dynamically changing block floating point format, so that e.g. a larger block size could be used when data rate needs to be reduced. The number of fractional exponent bits could then be selected dynamically.

As a general rule, if the block size is greater than a constant K times 2 raised to the power of F, where F is the present number of fractional exponents, then reduced noise is more efficiently attained by adding a fractional bit (increase F) than increasing the number of mantissa bits. K can typically be approximated as 20×log 10(2)/1.75 which is approximately 3.44. For mantissa sizes less than 5, K is somewhat larger, approximately 20×log 10(2)/1.65 for mantissa size 4, and still larger for still smaller mantissa sizes.

Figure 7:
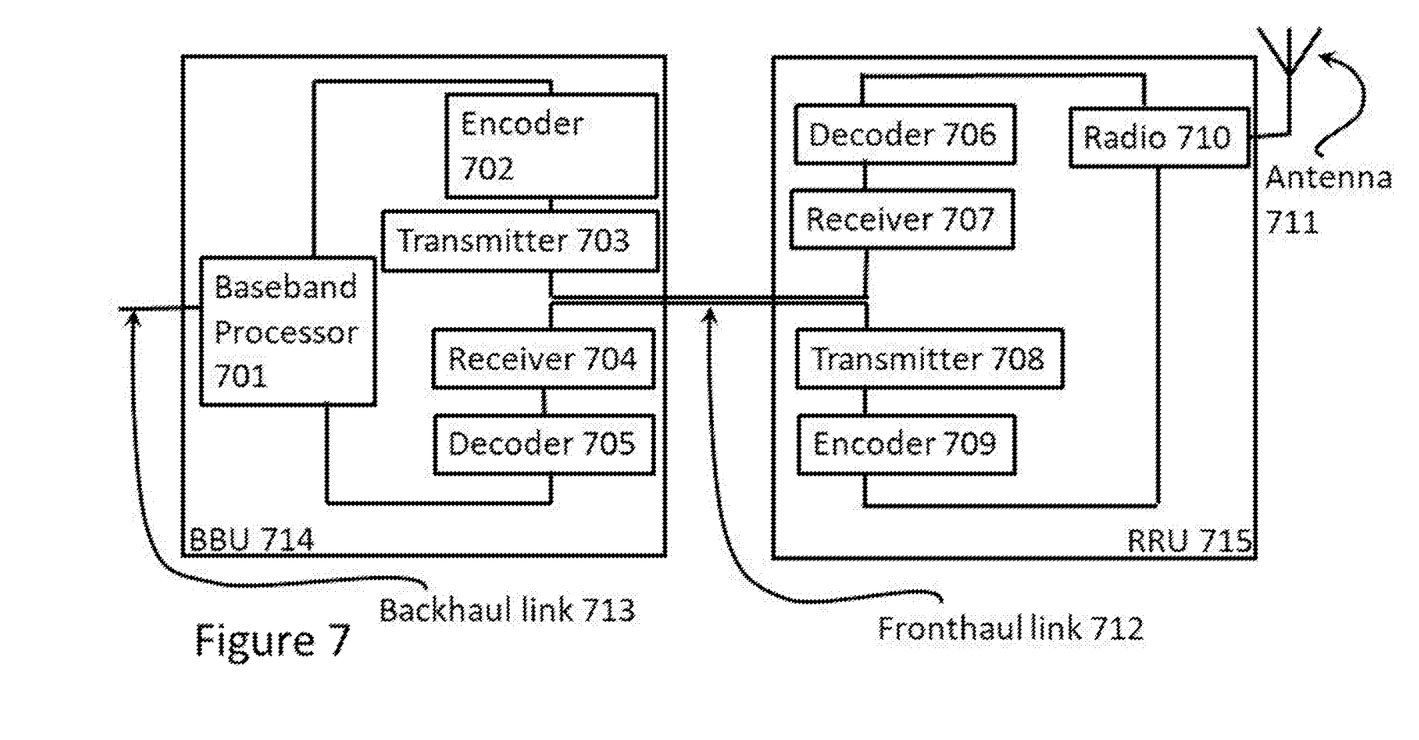
FIG. 7 is a schematic diagram showing functional modules of network nodes according to one embodiment.

Conversely, if block size is greater than K*2^F and bit rate needs to be reduced, it is better to reduce the number of mantissa bits, else it is better to reduce the number of fractional exponent bits FIG. 7 shows a BBU connected to an RRU via a fronthaul link.

The BBU 714 receives downlink data over the backhaul link 713 and the baseband processor 701 produces from the data signal samples that are to be transmitted over the air. The signal samples are encoded by the encoder 702 into a block floating point structure with one or more fractional exponents as described above and transmitted over the fronthaul link 712 by the transmitter 703. The blocks are received by the receiver 707 in the RRU 715 decoded by the decoder 706 as described above and transmitted over the air by the radio 710 through the antenna 711.

Uplink data from e.g. a UE is received in the RRU 715 by the radio 710 through the antenna 711. The data is encoded as described above by the encoder 709 and transmitted over the fronthaul link 712 by the transmitter 708. In the BBU 714 it is received by the receiver 704, decoded by the decoder 705 as described above. The decoded samples are processed by the baseband processor 701 and finally transmitted on the backhaul link 713.

Figure 8:
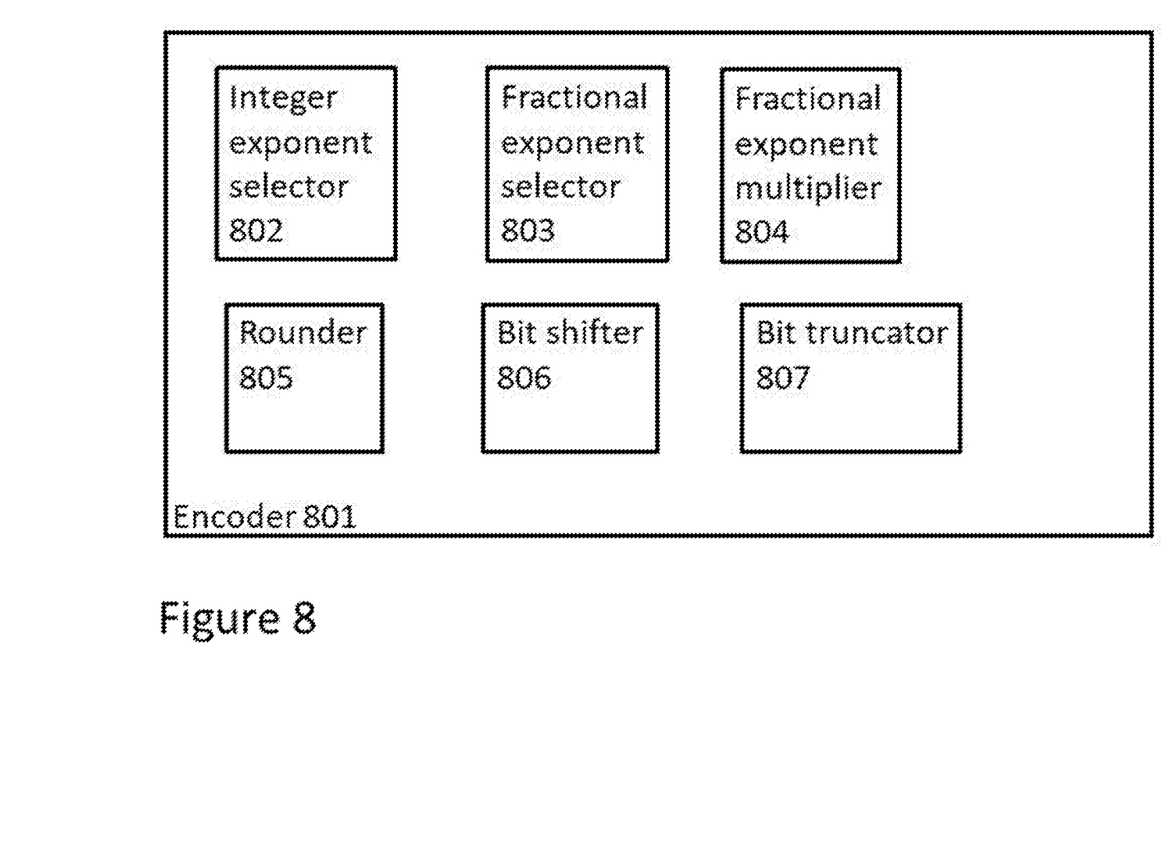
FIG. 8 is a schematic diagram showing functional modules of an encoder according to one embodiment.

FIG. 8 shows an encoder 801 which could be used as the encoder 702 or 709 of FIG. 7. The Integer exponent selector 802 selects an exponent such that the most significant non-zero bit of the largest sample in the block (or sub-block) will be in the most significant bit position of the mantissa of the block transfer format after bit-shift according to the exponent, rounding and truncation. The fractional exponent selector 803 selects a fractional exponent corresponding to the largest multiplier that the bit-shifted, rounded and truncated value could be multiplied and still fit in the mantissa of the block transfer format. The fractional exponent multiplier 804 multiplies the value with the multiplier selected by the fractional exponent selector 803. The rounder 805 rounds the value to the number of bits of the block transfer format mantissa, the bit shifter 806 shifts the bits according to the exponent selected by the integer exponent selector 802 and excess least significant bits of the value are truncated by the bit truncator 807.

Figure 9:
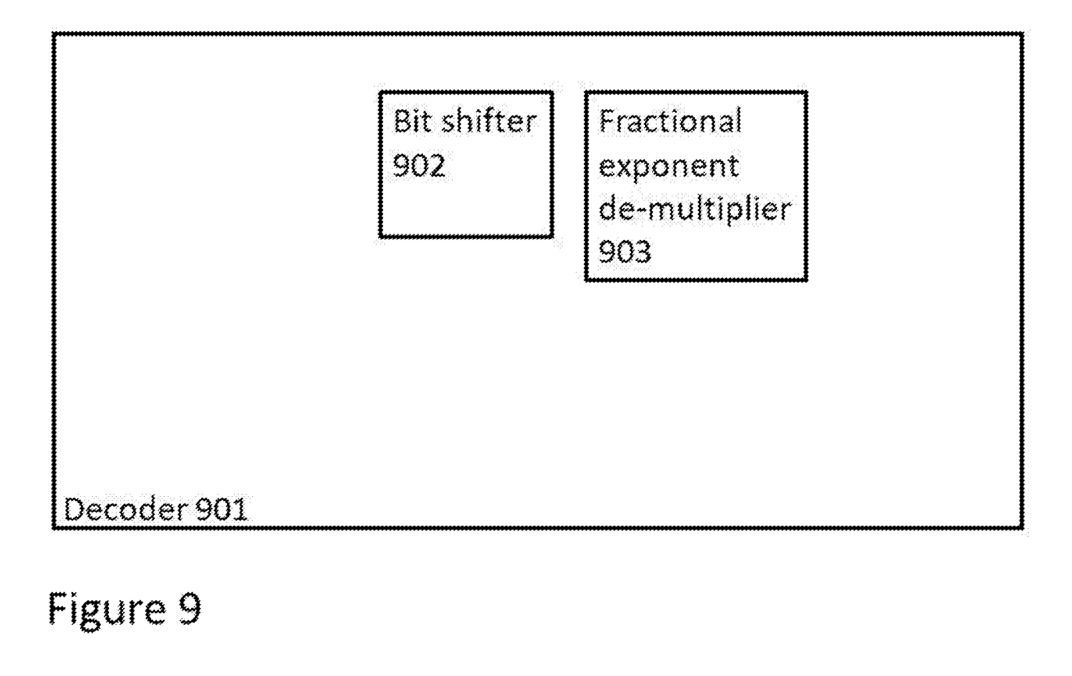
FIG. 9 is a schematic diagram showing functional modules of a decoder according to one embodiment.

FIG. 9 shows a decoder 901 which could be used as the decoder 705 or 706 of FIG. 7.

The bit shifter 902 shifts the bits of a received sample according to the integer exponent so as to reverse the shifting done by the bit shifter 806 of FIG. 8. The fractional exponent de-multiplier divides the value according to the fractional exponent so as to reverse the multiplication done by the fractional exponent multiplier 804 of FIG. 8.

Figure 10:
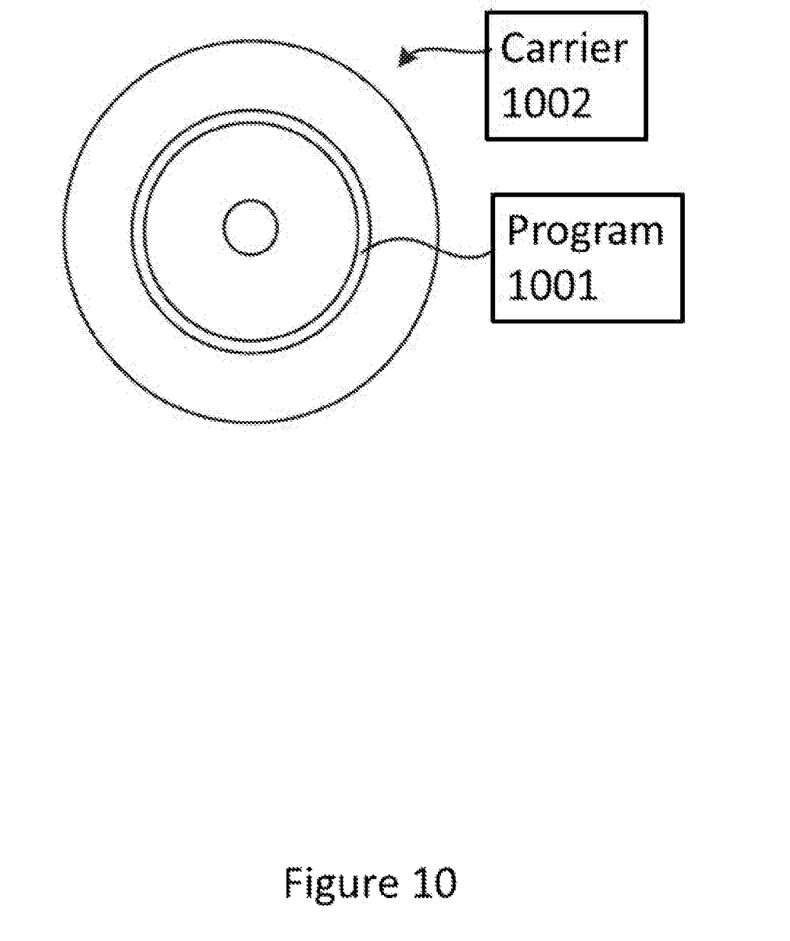
FIG. 10 shows one example of a computer program product comprising computer readable means.

FIG. 10 shows a carrier 1002 on which is stored a computer program 1001 comprising instructions which when executed by a processor causes the processor to perform one or more of the methods described herein.

Figure 11:
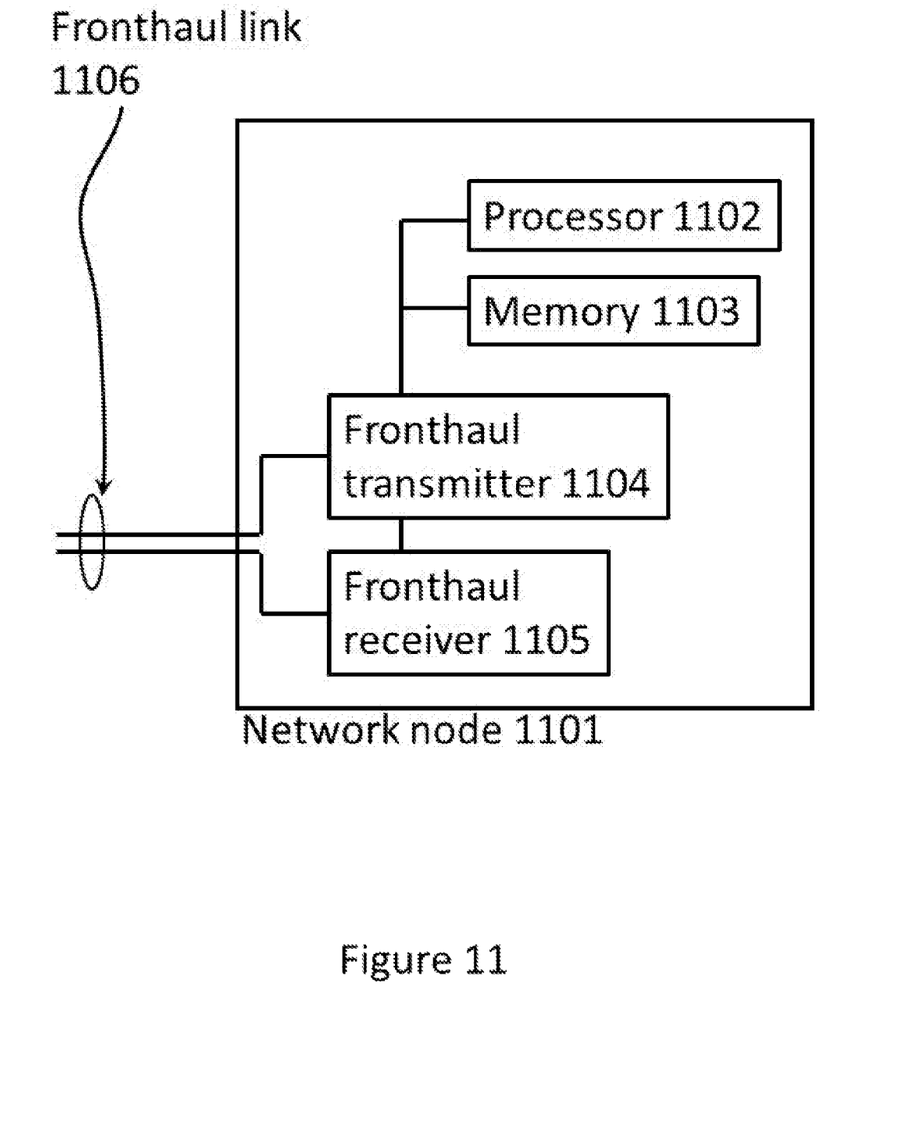
FIG. 11 is a schematic diagram illustrating components of a network node according to an embodiment.

FIG. 11 shows a network node 1101 comprising a processor 1102, memory 1103, fronthaul transmitter 1104 and fronthaul receiver 1105 for communication over the fronthaul link 1106. When the node is an RRU, it may comprise a radio (not shown). When the node is a BBU it may comprise a backhaul connection (not shown).

By suitable programming of the processor 1102, the elements of FIGS. 7, 8 and 9 may be implemented, as well as the methods of FIGS. 3 and 5 and other elements and methods described herein.

The invention claimed is:

1. A method for fronthaul data transfer performed in a first network node of a wireless communications network comprising:
sending IQ sample pairs or beam coefficients in a block floating point format to a second network node of the wireless communications network via a fronthaul link, the blocks having a size number (Ns) equal to or greater than 4, and including a number of integer exponent bits (Ne) and a number of fractional exponent bits (Nf), where Nf being at least 1, wherein the Ne integer exponent bits of a block are applicable to all samples in the block and two or more disjunct sets of fractional exponent bits out of a full set of Nf fractional exponent bits are applicable to corresponding disjunct subsets of samples out of a full set of Ns samples in the block.

2. The method according to claim 1, wherein a block of size Ns=24 comprises 12 IQ sample pairs, the number of integer exponent bits Ne is 4 and the number of fractional exponent bits Nf is 4, each fractional exponent bit being applicable to 3 IQ sample pairs.

3. The method according to claim 1, wherein a block of size Ns=24 comprises 12 IQ sample pairs, the number of integer exponent bits Ne is 2 and the number of fractional exponent bits Nf is 6, each fractional exponent bit being applicable to 2 IQ sample pairs.

4. The method according to claim 1, wherein the block size Ns is 8 or greater and Nf is at least 2.

5. The method according to claim 1, wherein Ne is less than 8 and Nf is less than or equal to 8-Ne.

6. The method according to claim 1, wherein at least one fractional exponent bit signifies for an IQ pair a magnitude change by a factor of 2 raised to a power of N/2, where N is an odd integer, and a rotation in a complex plane of an odd integer multiple of 45 degrees.

7. The method according to claim 1, wherein the first network node is a Base Band Unit (BBU) and the second network node is a Remote Radio Unit (RRU).

8. The method according to claim 1, wherein the first network node is a Remote Radio Unit (RRU) and the second network node is a Base Band Unit (BBU).

9. A network node for performing fronthaul data transfer in a wireless communications network comprising:
a processor; and
a memory storing instructions that, when executed by the processor, cause the network node to perform operations to:
send IQ sample pairs or beam coefficients in a block floating point format to a second network node of the wireless communications network via a fronthaul link, the blocks having a size number (Ns) equal to or greater than 4, and including a number of integer exponent bits (Ne) and a number of fractional exponent bits (Nf), where Nf being at least 1, wherein the Ne integer exponent bits of a block are applicable to all samples in the block and two or more disjunct sets of fractional exponent bits out of a full set of Nf fractional exponent bits are applicable to corresponding disjunct subsets of samples out of a full set of Ns samples in the block.

10. A non-transitory computer-readable storage medium comprising computer program code which, when run on a processor of a first network node of a wireless communication network, are capable of causing a fronthaul data transfer comprising:
sending IQ sample pairs or beam coefficients in a block floating point format to a second network node of the wireless communications network via a fronthaul link, the blocks having a size number (Ns) equal to or greater than 4, and including a number of integer exponent bits (Ne) and a number of fractional exponent bits (Nf), where Nf being at least 1, wherein the Ne integer exponent bits of a block are applicable to all samples in the block and two or more disjunct sets of fractional exponent bits out of a full set of Nf fractional exponent bits are applicable to corresponding disjunct subsets of samples out of a full set of Ns samples in the block.

* * * * *

UNITED STATES PATENT AND TRADEMARK OFFICE
CERTIFICATE OF CORRECTION

PATENT NO. : 11,632,139 B2
APPLICATION NO. : 17/312932
DATED : April 18, 2023
INVENTOR(S) : Berg et al.

It is certified that error appears in the above-identified patent and that said Letters Patent is hereby corrected as shown below:

In the Specification

In Column 1, Line 27, delete "center" and insert -- center. --, therefor.

In Column 1, Line 50, delete "Jul. 27]" and insert -- Jul. 27]. --, therefor.

In Column 2, Line 28, delete "bit" and insert -- bit. --, therefor.

In Column 4, Line 3, delete "eight" and insert -- eighth --, therefor.

In Column 6, Line 33, delete "$2^{N_f}$" and insert -- $2^{Nf}$ --, therefor.

In Column 6, Line 34, delete "$K=\{2^{k_\varphi}\}$," and insert -- $K=\{2^{k\varphi}\}$, --, therefor.

In Column 6, Line 34, delete "$2^{N_f}-1$" and insert -- $2^{Nf}-1$ --, therefor.

In Column 6, Line 35, delete "$\varphi=2^{N_f}$" and insert -- $\varphi=2^{-Nf}$. --, therefor.

In Column 6, Line 36, delete "$\{1,\sqrt{2}\}$." and insert -- $\{1,\sqrt{2}\}$. --, therefor.

In Column 7, Line 50, delete "$\sqrt{2}$." and insert -- $\sqrt{2}$ --, therefor.

In Column 8, Line 25, delete "$\sqrt{2}$" and insert -- $\sqrt{2}$ --, therefor.

Signed and Sealed this
Twenty-fourth Day of October, 2023

Katherine Kelly Vidal
*Director of the United States Patent and Trademark Office*

In Column 8, Line 38, delete "502)" and insert -- 502). --, therefor.

In Column 8, Line 41, delete "$\sqrt{2}$." and insert -- $\sqrt{2}$. --, therefor.

In Column 8, Line 42, delete "$\sqrt{2}$" and insert -- $\sqrt{2}$ --, therefor.

In Column 8, Line 44, delete "$\sqrt{2}$" and insert -- $\sqrt{2}$ --, therefor.

In Column 8, Line 46, delete "decimal)" and insert -- decimal). --, therefor.

In Column 8, Line 50, delete "of 4)" and insert -- of 4). --, therefor.

In Column 8, Line 63, delete "$\sqrt{2}$" and insert -- $\sqrt{2}$ --, therefor.

In Column 8, Line 63, delete "made)" and insert -- made). --, therefor.

In Column 9, Line 3, delete "decimal)" and insert -- decimal). --, therefor.

In Column 9, Line 4, delete "$\sqrt{2}$" and insert -- $\sqrt{2}$ --, therefor.

In Column 9, Line 5, delete "$\sqrt{2}$," and insert -- $\sqrt{2}$, --, therefor.

In Column 9, Line 6, delete "decimal)" and insert -- decimal). --, therefor.

In Column 9, Line 8, delete "$\sqrt{2}$" and insert -- $\sqrt{2}$ --, therefor.

In Column 9, Line 14, delete "$\sqrt{2}$" and insert -- $\sqrt{2}$ --, therefor.

In Column 9, Line 17, delete "$\sqrt{2}$" and insert -- $\sqrt{2}$ --, therefor.

In Column 9, Line 23, delete "$y_k=(1+j) \cdot x_k=(Re(x_k)-im(x_k)+j \cdot (Re(x_k)+lm(x_k))$" and insert -- $y_k=(1+j) \cdot x_k=(Re\{x_k\}-Im\{x_k\}+j \cdot (Re\{x_k\}+Im\{x_k\})$ --, therefor.

In Column 9, Line 33, delete "$\sqrt{2}$" and insert -- $\sqrt{2}$ --, therefor.

In Column 10, Line 9, delete "20×log 10(2)/1.75" and insert -- 20×log10(2)/1.75 --, therefor.

In Column 10, Line 11, delete "20×log 10(2)/1.65" and insert -- 20×log10(2)/1.65 --, therefor.

CERTIFICATE OF CORRECTION (continued)
U.S. Pat. No. 11,632,139 B2

In the Claims

In Column 12, Lines 29-30, in Claim 10, delete "communication" and insert -- communications --, therefor.